(12) United States Patent
Uno

(10) Patent No.: US 7,008,865 B2
(45) Date of Patent: Mar. 7, 2006

(54) METHOD OF MANUFACTURING A SEMICONDUCTOR DEVICE HAVING A HIGH BREAKDOWN VOLTAGE AND LOW ON-RESISTANCE

(75) Inventor: Toshihiko Uno, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/784,219

(22) Filed: Feb. 24, 2004

(65) Prior Publication Data

US 2004/0164376 A1    Aug. 26, 2004

Related U.S. Application Data

(62) Division of application No. 10/307,361, filed on Dec. 2, 2002, now abandoned.

(30) Foreign Application Priority Data

Dec. 3, 2001    (JP) .............................. 2001-368089

(51) Int. Cl.
*H01L 21/425* (2006.01)
(52) U.S. Cl. ...................... 438/527; 257/339; 257/342; 438/514; 438/549
(58) Field of Classification Search ........ 257/335–336, 257/339, 342–343; 438/188, 514, 527, 549
See application file for complete search history.

(56) References Cited

U.S. PATENT DOCUMENTS

| | | | |
|---|---|---|---|
| 4,609,929 A | 9/1986 | Jayaraman et al. | |
| 4,626,879 A | 12/1986 | Colak | |
| 5,386,136 A | 1/1995 | Williams et al. | |
| 6,072,216 A * | 6/2000 | Williams et al. | ............ 257/339 |
| 6,168,983 B1 | 1/2001 | Rumennik et al. | |
| 6,424,007 B1 | 7/2002 | Disney | |
| 6,451,640 B1 | 9/2002 | Ichikawa | |
| 6,482,681 B1 | 11/2002 | Francis et al. | |
| 6,492,679 B1 * | 12/2002 | Imam et al. | ................ 257/342 |
| 2002/0137292 A1 | 9/2002 | Hossain et al. | |

OTHER PUBLICATIONS

S. Wolf et al., Silicon Processing for the VLSI Era, vol. 1—Process Technology, 1986, Lattice Press, pp. 26-28, 283-292.*

W.S. Ruska, Microelectronic Processing, 1987, McGraw-Hill, pp. 311-316.

* cited by examiner

*Primary Examiner*—Allan R. Wilson
(74) *Attorney, Agent, or Firm*—McDermott Will & Emery LLP

(57) ABSTRACT

A semiconductor device includes a semiconductor substrate of a first conductivity type, in which an extended drain region of a second conductivity type and a source region of the second conductivity type are formed with an interval therebetween, wherein the extended drain region includes a plurality of buried layers, each formed by burying an impurity layer of the first conductivity type, the plurality of buried layers extending substantially parallel to a substrate surface and with an interval therebetween in a depth direction. A concentration of an impurity of the second conductivity type in the extended drain region at a depth of about 6 $\mu$m from the substrate surface is about $1\times10^{15}/cm^3$ or more and is about 30% or more of that at a depth of about 2 $\mu$m from the substrate surface.

3 Claims, 11 Drawing Sheets

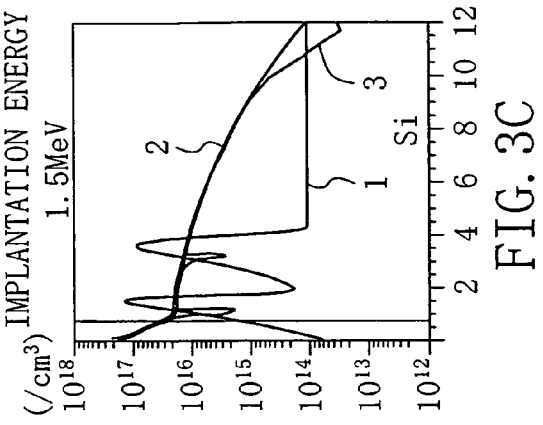
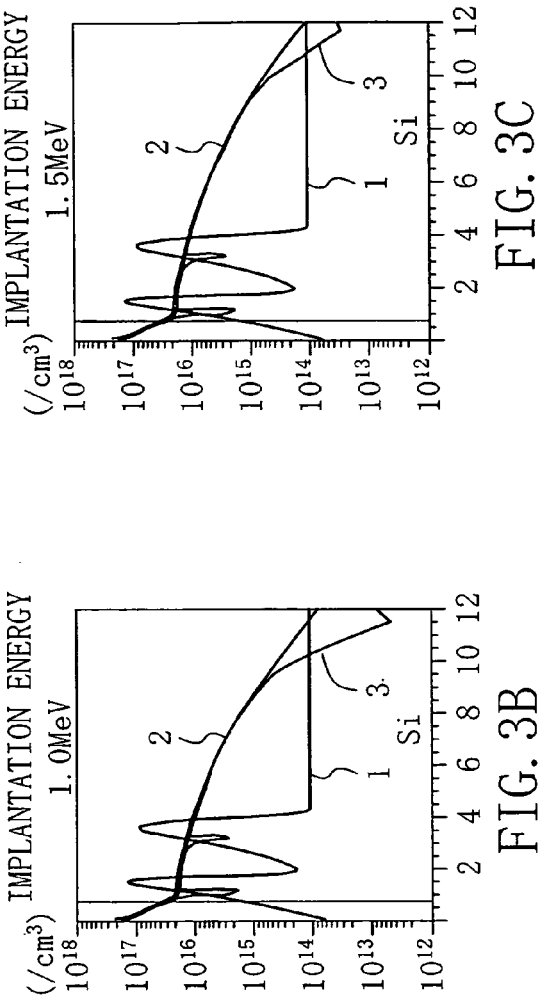
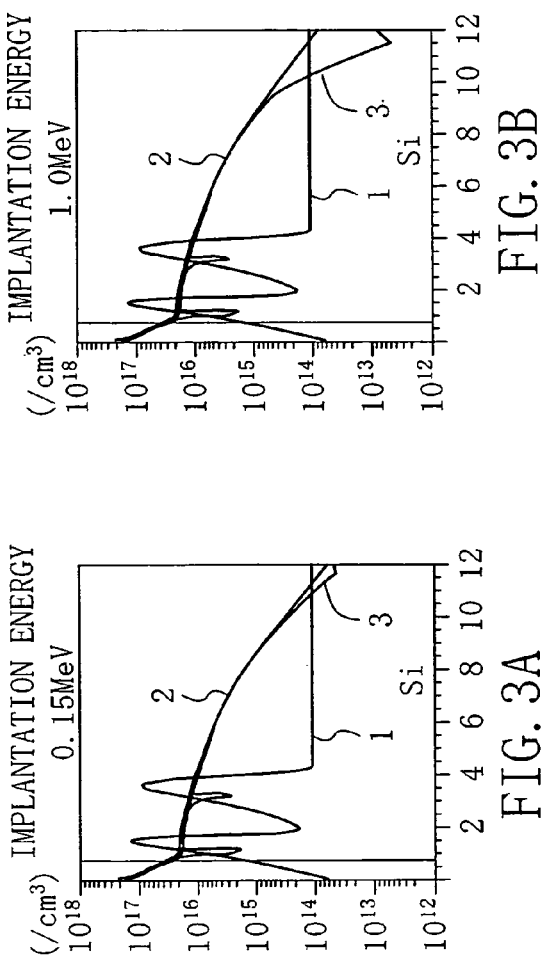
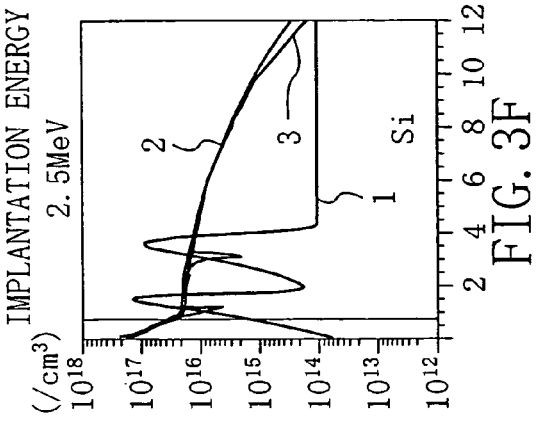
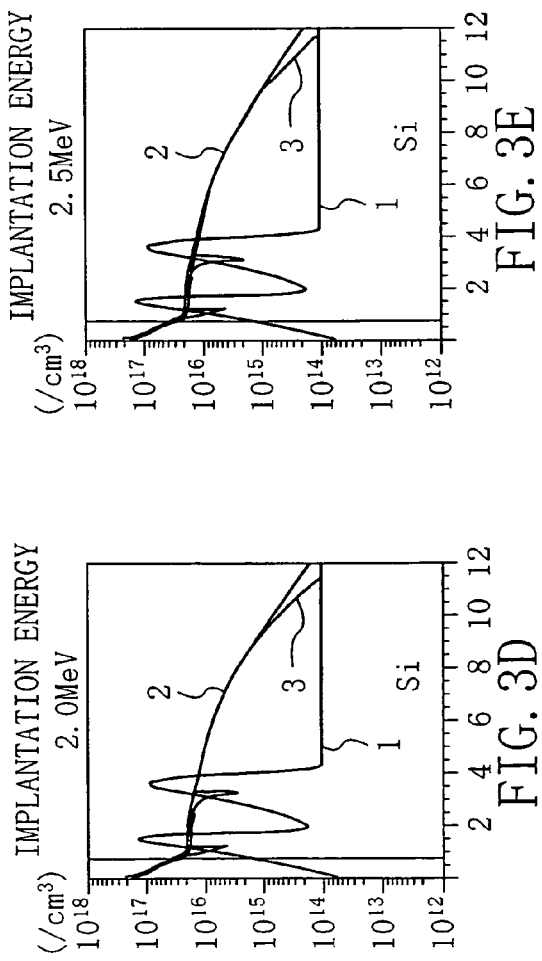

METHOD OF MANUFACTURING A SEMICONDUCTOR DEVICE HAVING A HIGH BREAKDOWN VOLTAGE AND LOW ON-RESISTANCE

This application is a divisional of application Ser. No. 10/307,361, filed Dec. 2, 2002, now abn.

BACKGROUND OF THE INVENTION

The present invention relates to a semiconductor device having a high breakdown voltage and a method for manufacturing the same.

Various structures have been studied in the prior art for a lateral semiconductor device with which the on-state resistance can be reduced while ensuring a high breakdown voltage. An example of such a semiconductor device is disclosed in U.S. Pat. No. 6,168,983, which will now be described with reference to the drawings.

FIG. 10 is a cross-sectional view illustrating a first semiconductor device disclosed in the U.S. patent.

As illustrated in FIG. 10, an n-type source region 14 and an n-type extended drain region 23 are formed with an interval therebetween in an upper portion of a p-type semiconductor substrate 16. A drain contact portion 19 electrically connected to a drain electrode 11 is formed in an upper portion of the extended drain region 23.

A p-type buried layer 18 is formed in the extended drain region 23 so as to extend substantially parallel to the substrate surface. Thus, in the extended drain region 23, an n-type upper layer region 24 is formed over the p-type buried layer 18 while an n-type lower layer region 25 is formed under the p-type buried layer 18.

A p-type substrate contact region 13 is formed in an upper portion of the semiconductor substrate 16 so as to be in contact with the source region 14, and the source region 14 and the substrate contact region 13 are both electrically connected to a source electrode 10.

A gate electrode 12 is formed on the semiconductor substrate 16, with a gate insulating film 20 being interposed therebetween, in an area between the source region 14 and the extended drain region 23, and a region of the semiconductor substrate 16 that is located under the gate electrode 12 functions as a channel region 28. The surface of the semiconductor substrate 16, including the gate electrode 12 formed thereon, is covered by an insulating film 27.

Thus, the first semiconductor device is characterized in that the n-type upper layer region 24 and the p-type buried layer 18 are provided within the n-type extended drain region 23.

Since the p-type buried layer 18 is set to the reference potential via the semiconductor substrate 16, the extended drain region 23 and the semiconductor substrate 16 are reversely biased, and the extended drain region 23 and the p-type buried layer 18 are also reversely biased, when a voltage is applied to the extended drain region 23. Therefore, a depletion layer expands from the junction between the extended drain region 23 and the p-type buried layer 18, while a depletion layer also expands from the junction between the extended drain region 23 and the semiconductor substrate 16. By utilizing the dielectric breakdown voltage of these depletion layers, it is possible to increase the breakdown voltage of a MOS transistor.

When a voltage is applied to the gate electrode 12, the channel region of the MOS transistor is turned conductive, and a drain inner current primarily flows through the extended drain region 23 while being divided into two flows, one through the n-type upper layer region 24 and the other through the n-type lower layer region 25, as indicated by broken lines. Therefore, in order to obtain a high breakdown voltage, the impurity concentration of the n-type lower layer region 25, which is located under the p-type buried layer 18 in the extended drain region 23, is reduced, so as to increase the size of the depletion layer that expands from the junction when a reverse bias voltage is applied.

In order to reduce the impurity concentration of the n-type lower layer region 25, the concentration of the doped impurity is reduced and the impurity is thermally diffused in the step of forming the extended drain region 23.

However, when the impurity concentration of the n-type lower layer region 25 is reduced, the on-state resistance increases. Therefore, it is not preferred that the impurity concentration of the n-type lower layer region 25 is reduced excessively. Thus, in order to reduce the on-state resistance while ensuring a high breakdown voltage, it is necessary to increase the impurity concentration of the n-type upper layer region 24, which is provided on the upper surface side.

However, when the impurity concentration of the n-type upper layer region 24 in the extended drain region 23 is high, the expansion of the depletion layer in the n-type upper layer region 24 upon application of the reverse bias voltage will be insufficient, thereby changing the electric field distribution and thus lowering the breakdown voltage. Therefore, it is not preferred to excessively increase the impurity concentration of the n-type upper layer region 24.

As described above, while the first semiconductor device aims at realizing both a reduced on-state resistance and a high breakdown voltage, they cannot be realized at the same time to a sufficient degree with the first semiconductor device.

The U.S. patent further discloses a second semiconductor device, in which another p-type buried layer is formed within the extended drain region 23 so as to extend substantially parallel to the substrate surface with an interval between the two p-type buried layers, in order to reliably reduce the on-state resistance while ensuring a high breakdown voltage. In this way, the breakdown voltage is improved without lowering the impurity concentration of the n-type lower layer region 25.

FIG. 11 is a cross-sectional view illustrating the second semiconductor device disclosed in the U.S. patent. As illustrated in FIG. 11, a first p-type buried layer 18A and a second p-type buried layer 18B are formed in the extended drain region 23. The first p-type buried layer 18A and the second p-type buried layer 18B below the first p-type buried layer 18A extend substantially parallel to the substrate surface and are spaced apart from each other in the depth direction.

In the second semiconductor device, the first p-type buried layer 18A and the second p-type buried layer 18B are formed in the extended drain region 23, whereby when a voltage that is a reverse bias to the semiconductor substrate 16 is applied to the extended drain region 23, a depletion layer expands from the junction between the extended drain region 23 and the first buried layer 18A, the junction between the extended drain region 23 and the second buried layer 18B, and the junction between the extended drain region 23 and the semiconductor substrate 16. Therefore, even if the impurity concentration of the n-type extended drain region 23 is set to be high, the depletion layers formed by the extended drain region 23 and the first and second buried layers 18A and 18B expand easily. Thus, it is possible to ensure a high breakdown voltage of the MOS transistor.

Moreover, when a current path is established between the extended drain region 23 and the source region 14, a current flows through the extended drain region 23 whose impurity is set to be high, whereby the on-state resistance can be reduced. In this way, it is possible to reliably reduce the on-state resistance while ensuring a high breakdown voltage.

The drain inner current of the MOS transistor flows while being divided into three separate flows respectively through the n-type upper layer region 24, an n-type intermediate layer region 26 and the n-type lower layer region 25 in the extended drain region 23, as indicated by broken lines in FIG. 11. Therefore, the resistance value of the extended drain region 23 of the MOS transistor can be represented by the parallel resistance value of the three-layer current path.

However, the second conventional semiconductor device as described above has the following problem. When forming the extended drain region 23, an n-type impurity, e.g., phosphorus (P) ion, is implanted and then thermally diffused so that the diffusion depth is about 5 μm to 15 μm. The ion implantation is performed with an implantation energy of about 100 keV to 150 keV. Therefore, while a surface region of the extended drain region 23 can be formed with a high concentration, the intermediate layer region 26 has a lower n-type impurity concentration, and the lower layer region 25 has an even lower n-type impurity concentration.

Therefore, the second conventional semiconductor device has a high resistance value in the intermediate layer region 26 and in the lower layer region 25 of the extended drain region 23, whereby the MOS transistor has an increased on-state resistance.

SUMMARY OF THE INVENTION

The present invention has been made in view of the above, and has an object to further reduce the on-state resistance while ensuring a high breakdown voltage.

In order to achieve the object, the present invention provides a semiconductor device having a high breakdown voltage in which the impurity concentration is sufficiently high at a relatively large depth in an extended drain region.

Specifically, a first semiconductor device of the present invention includes a semiconductor substrate of a first conductivity type, in which an extended drain region of a second conductivity type and a source region of the second conductivity type are formed with an interval therebetween, wherein: the extended drain region includes a plurality of buried layers, each formed by burying an impurity layer of the first conductivity type, the plurality of buried layers extending substantially parallel to a substrate surface and with an interval therebetween in a depth direction; and a concentration of an impurity of the second conductivity type in the extended drain region at a depth of about 6 μm from the substrate surface is about $1\times10^{15}/cm^3$ or more and is about 30% or more of that at a depth of about 2 μm from the substrate surface.

With the first semiconductor device of the present invention, when a current path is established between the extended drain region and the source region, a current desirably flows through the extended drain region even at a depth of about 6 μm from the substrate surface because the resistance value of the extended drain region is reduced. Thus, it is possible to reliably reduce the on-state resistance while ensuring a high breakdown voltage.

A second semiconductor device of the present invention includes a semiconductor substrate of a first conductivity type, in which an extended drain region of a second conductivity type and a source region of the second conductivity type are formed with an interval therebetween, wherein: the extended drain region includes a buried layer, formed by burying an impurity layer of the first conductivity type, the buried layer extending substantially parallel to a substrate surface; and a concentration of an impurity of the second conductivity type in the extended drain region, excluding the buried layer, at a depth of about 6 μm from the substrate surface is about $1\times10^{15}/cm^3$ or more and is about 30% or more of that at a depth of about 2 μm from the substrate surface.

In the first or second semiconductor device, it is preferred that the buried layer(s) is/are electrically connected to the semiconductor substrate. In this way, when applying a voltage that is a reverse bias to the extended drain region and the semiconductor substrate, the depletion layer occurring from the junction between the extended drain region and each buried layer reliably expands, whereby the breakdown voltage of the semiconductor device is reliably improved.

A method for manufacturing a semiconductor device of the present invention includes: a first step of selectively implanting. a semiconductor substrate of a first conductivity type with impurity ion of a second conductivity type with an implantation energy that is equal to or greater than about 1.0 MeV and less than or equal to about 3.0 MeV so as to form an extended drain region of the second conductivity type in an upper portion of the semiconductor substrate; and a second step of forming a plurality of buried layers, each being an impurity layer of the first conductivity type, in the extended drain region so that the plurality of buried layers extend substantially parallel to a substrate surface with an interval therebetween in a depth direction.

With the method for manufacturing a semiconductor device of the present invention, the extended drain region of the second conductivity type is formed in an upper portion of the semiconductor substrate by selectively implanting the semiconductor substrate of the first conductivity type with impurity ion of the second conductivity type with an implantation energy that is equal to or greater than about 1.0 MeV and less than or equal to about 3.0 MeV, whereby the concentration of the impurity of the second conductivity type at a depth of about 6 μm from the substrate surface is about $1\times10^{15}/cm^3$ or more and is about 30% or more of that at a depth of about 2 μm from the substrate surface. Thus, it is possible to reliably realize the first semiconductor device. In addition, the on-state resistance can be reduced simply by setting the implantation energy for implanting impurity ion to form the extended drain region to be high, which does not lead to an increase in the manufacturing cost.

In the method for manufacturing a semiconductor device of the present invention, it is preferred that the first step includes a step of performing a heat treatment on the semiconductor substrate so that a diffusion depth of the extended drain region is equal to or greater than about 5 μm and less than or equal to about 15 μm.

In the method for manufacturing a semiconductor device of the present invention, it is preferred that in the second step, the plurality of buried layers are successively formed by an ion implantation method, starting from the buried layer at a deepest position to the buried layer at a shallowest position in the extended drain region. In this way, the plurality of buried layers can be reliably formed within the extended drain region.

BRIEF DESCRIPTION OF THE DRAWINGS

FIG. 3A to FIG. 3F are graphs illustrating impurity concentration profiles in the depth direction in an extended drain region of the semiconductor device according to the embodiment of the present invention, for different n-type impurity implantation energies of 0.15 MeV, 1.0 MeV, 1.5 MeV, 2.0 MeV, 2.5 MeV and 3.0 MeV, respectively.

FIG. 8A and FIG. 8B illustrate a semiconductor device according to a first variation of the embodiment of the present invention, wherein FIG. 8A is a cross-sectional view illustrating the semiconductor device, and FIG. 8B is a cross-sectional view schematically illustrating the expansion of a depletion layer when a voltage is applied to a drain electrode.

DETAILED DESCRIPTION OF THE INVENTION

An embodiment of the present invention will now be described with reference to the drawings.

Figure 1:
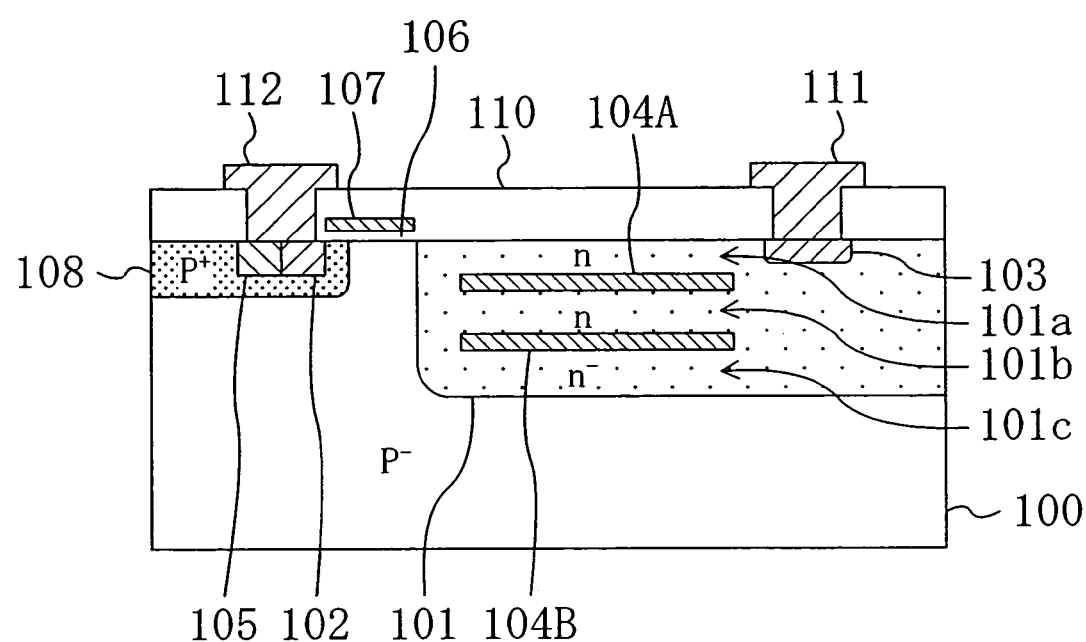
FIG. 1 is a cross-sectional view illustrating a semiconductor device according to an embodiment of the present invention.

FIG. 1 is a cross-sectional view illustrating a semiconductor device, which is a high-voltage MOS transistor, according to the embodiment of the present invention.

As illustrated in FIG. 1, the semiconductor device includes a semiconductor substrate 100 made of silicon whose p-type impurity concentration is about $1\times10^{14}/cm^3$ to about $3\times10^{14}/cm^3$. An n-type extended drain region 101 and an n-type source region 102 are formed with an interval therebetween in an upper portion of the semiconductor substrate 100. In an upper portion of the extended drain region 101, a drain contact portion 103 is formed. The drain contact portion 103 is electrically connected, via a contact section, to a drain electrode 111 formed on an insulating film 110.

The extended drain region 101 is formed by implantation of an n-type impurity with a very high implantation energy of about 1.0 MeV to about 3.0 MeV, followed by thermal diffusion: In such a case, the n-type impurity concentration at a depth of about 6 μm from the substrate surface is about $1\times10^{15}/cm^3$ or more and is about 30% or more of that at a depth of about 2 μm. Moreover, the junction depth is about 5 μm to about 15 μm.

A first p-type buried layer 104A whose p-type impurity concentration is about $2.5\times10^{16}/cm^3$ is formed in the extended drain region 101 at a depth of about 1.0 μm so as to extend substantially parallel to the substrate surface. Moreover, a second p-type buried layer 104B whose impurity concentration is about $1.5\times10^{16}/cm^3$ is formed in the extended drain region 101 at a depth of about 3.5 μm so as to extend in parallel to the first p-type buried layer 104A. The first p-type buried layer 104A and the second p-type buried layer 104B are either both electrically connected to the semiconductor substrate 100 or both electrically floating.

As described above, the extended drain region 101 includes therein the first p-type buried layer 104A and the second p-type buried layer 104B, which extend substantially parallel to the substrate surface at respective predetermined depths with an interval therebetween in the depth direction. Therefore, an n-type upper layer region 101a is formed over the first p-type buried layer 104A, an n-type intermediate layer region 101b is formed between the first p-type buried layer 104A and the second p-type buried layer 104B, and an n⁻-type lower layer region 101c is formed under the second p-type buried layer 104B.

Note that in a case where only one p-type buried layer is provided, the cross-sectional area of the lower layer region 101c in the extended drain region 101 increases, whereby the breakdown voltage slightly decreases, but the on-state resistance is sufficiently reduced.

A p⁺⁺-type substrate contact region 105 is formed adjacent to the source region 102 in an upper portion of the semiconductor substrate 100 on one side of the source region 102 that is away from the extended drain region 101. The substrate contact region 105 is electrically connected to the semiconductor substrate 100.

The source region 102 and the substrate contact region 105 are electrically connected to each other via a source electrode 112 and a contact section, which are both formed on the insulating film 110, whereby the source electrode 112 is set to the same potential as the semiconductor substrate 100.

A gate electrode 107 is formed on the semiconductor substrate 100, with a gate insulating film 106 being interposed therebetween, in an area between the extended drain region 101 and the source region 102. Therefore, a region of the semiconductor substrate 100 that is located under the gate electrode 107 functions as a channel region.

The source region 102 and the substrate contact region 105 are surrounded by a p⁺-type anti-punch-through region 108 whose p-type impurity concentration is higher than that of the semiconductor substrate 100. Therefore, the expansion of a depletion layer from the extended drain region 101 into the channel region is suppressed by the anti-punch-through region 108, thereby preventing a so-called "punch through phenomenon".

The semiconductor device of the present embodiment includes the first p-type buried layer 104A and the second p-type buried layer 104B, which are formed in the extended drain region 101 so as to extend substantially parallel to the substrate surface with an interval therebetween in the depth direction, whereby when a predetermined voltage is applied to the extended drain region 101, the n-type extended drain region 101 and the p-type semiconductor substrate 100 are reversely biased, and the n-type extended drain region 101 is reversely biased with respect to the first p-type buried layer 104A and the second p-type buried layer 104B.

Figure 2A:
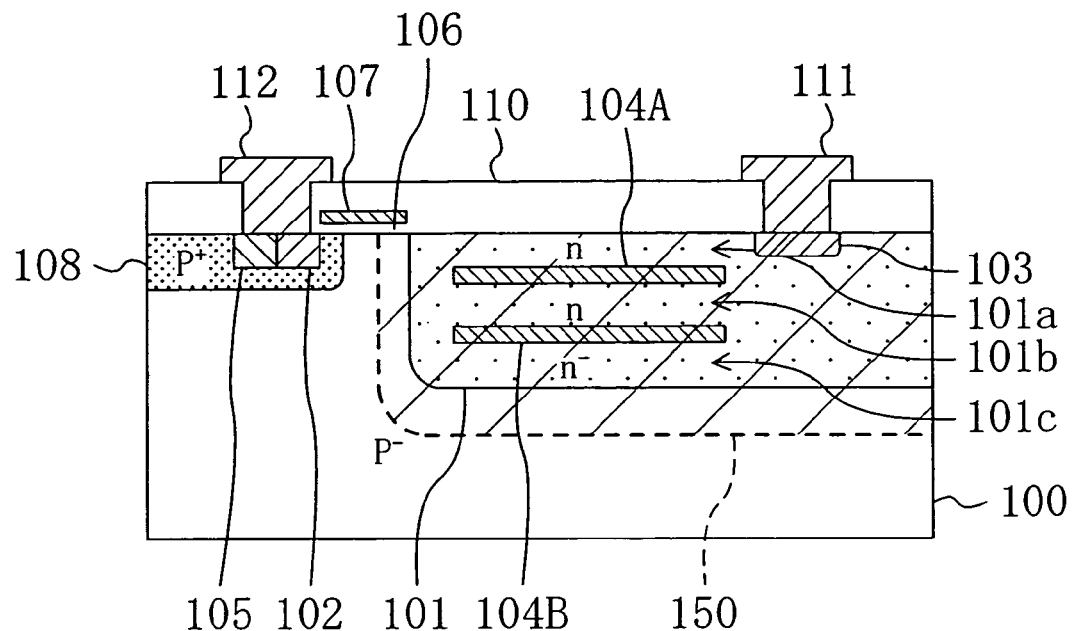
FIG. 2A and FIG. 2B illustrate the semiconductor device according to the embodiment of the present invention, wherein FIG. 2A schematically illustrates the expansion of a depletion layer when a voltage is applied to a drain electrode, and FIG. 2B schematically illustrates the flow of a drain current.

Therefore, as illustrated in FIG. 2A, a depletion layer expands from the junction between the first p-type buried layer 104A and the extended drain region 101, the junction between the second p-type buried layer 104B and the extended drain region 101, and the junction between the extended drain region 101 and the semiconductor substrate 100, and these depletion layers together form a continuous depletion layer 150. Thus, the region of the depletion layer 150 is sufficiently large, whereby it is possible to increase the breakdown voltage of the MOS transistor.

Figure 2B:
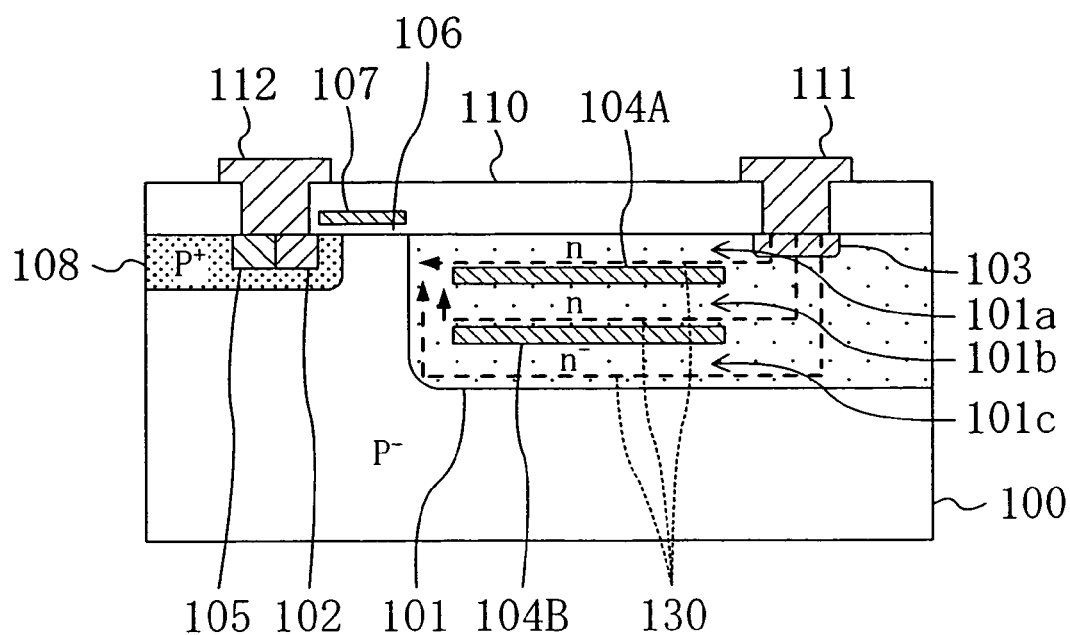

Moreover, with the semiconductor device of the present embodiment, when a voltage is applied to the gate electrode 107 and the channel region of the MOS transistor is turned conductive, a drain inner current 130 in the extended drain region 101 flows through each of the upper layer region 101a, the intermediate layer region 101b and the lower layer region 101c of the extended drain region 101, as indicated by broken lines in FIG. 2B.

Figure 4A:
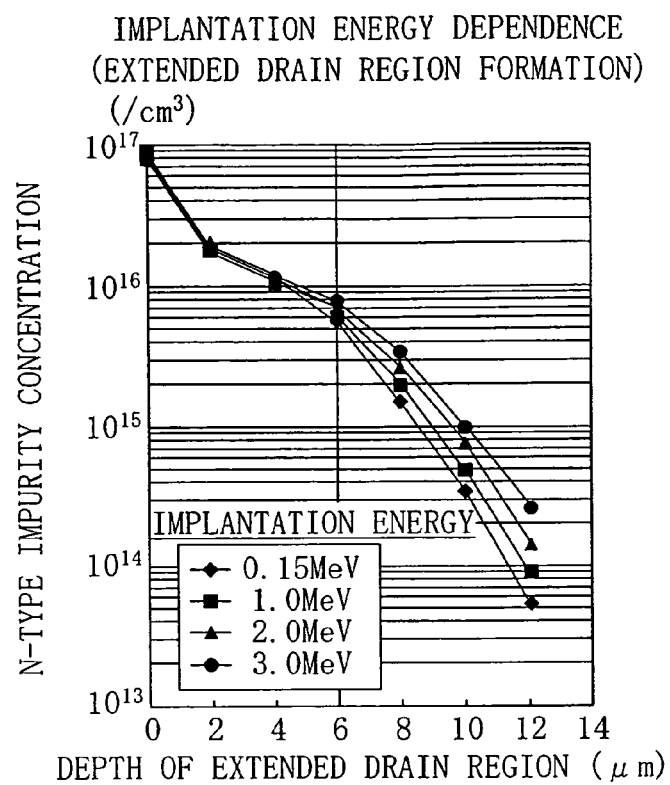
FIG. 4A is a graph illustrating the ion implantation energy dependence of the n-type impurity concentration in the depth direction of the extended drain region of the semiconductor device according to the embodiment of the present invention.
Figure 4B:
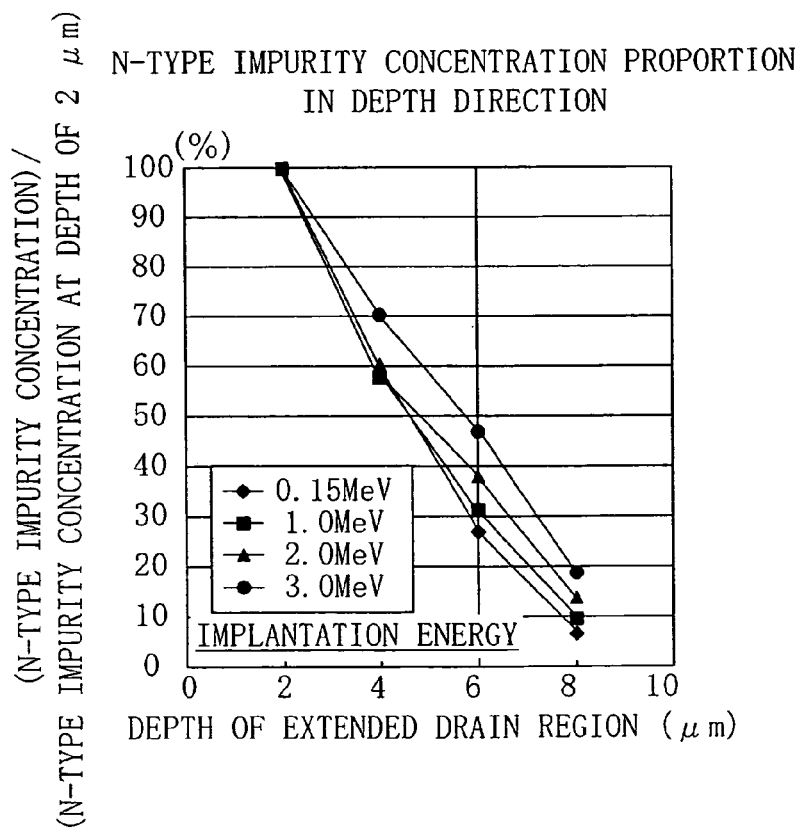
FIG. 4B is a graph illustrating the ion implantation energy dependence of the n-type impurity concentration proportion in the depth direction with respect to the reference n-type impurity concentration at a depth of 2 μm in the extended drain region of the semiconductor device according to the embodiment of the present invention.

Since the extended drain region 101 of the present embodiment is implanted with n-type impurity ion with a very high energy of about 1.0 MeV to about 3.0 MeV, the net n-type impurity concentration is about $1.5 \times 10^{15}/cm^3$ or more at a depth of about 6 μm, as can be seen from FIG. 3A to FIG. 3F and from FIG. 4A, in which the data shown in FIG. 3A to FIG. 3F are put together into a single graph. In FIG. 3A to FIG. 3F, Curve 1 represents the concentration of boron (B), which is a p-type impurity, Curve 2 represents the concentration of phosphorus (P), which is an n-type impurity, and Curve 3 represents the net concentration of the n-type impurity. Moreover, as can be seen from FIG. 4B, an n-type impurity concentration that is 30% or more of that at a depth of 2 μm is ensured.

Therefore, the n-type impurity concentration in the intermediate layer region 101b and the lower layer region 101c of the extended drain region 101 can be made higher than that in the prior art, whereby it is possible to reduce the on-state resistance while ensuring a high breakdown voltage.

As described above, according to the present embodiment, the extended drain region 101 of the high-voltage MOS transistor is formed by ion implantation with a very high impurity implantation energy of about 1.0 MeV to about 3.0 MeV. Therefore, the n-type impurity concentration over the second p-type buried layer 104B and that under the second p-type buried layer 104B can both be made high, whereby it is possible to significantly reduce the on-state resistance while ensuring a high breakdown voltage.

A method for manufacturing a semiconductor device as described above will now be described with reference to the drawings.

FIG. 5A to FIG. 7 are cross-sectional views sequentially illustrating steps in a method for manufacturing a semiconductor device according to the embodiment of the present invention.

Figure 5A:
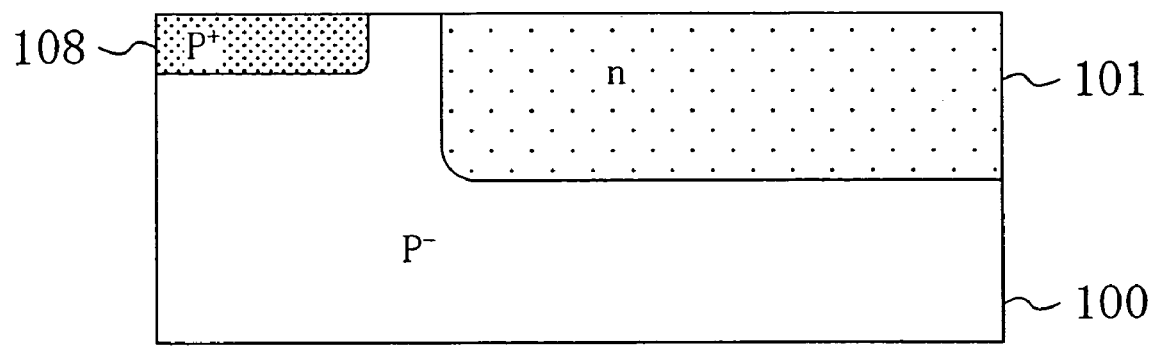
FIG. 5A and FIG. 5B are cross-sectional views sequentially illustrating steps in a method for manufacturing a semiconductor device according to the embodiment of the present invention.

First, as illustrated in FIG. 5A, an n-type impurity, e.g., phosphorus (P) ion, is selectively implanted with an implantation energy of about 1.0 MeV to 3.0 MeV into the silicon semiconductor substrate 100 whose p-type impurity concentration is about $1 \times 10^{14}/cm^3$ to $3 \times 10^{14}/cm^3$, and then the implanted n-type impurity is thermally diffused, thereby forming the n-type extended drain region 101 whose junction depth is about 5 μm to 15 μm. Then, a p-type impurity, e.g., boron (B) ion, is selectively implanted into a region that is spaced apart in the substrate surface direction from the extended drain region 101 in an upper portion of the semiconductor substrate 100, thereby forming the $p^+$-type anti-punch-through region 108.

Figure 5B:
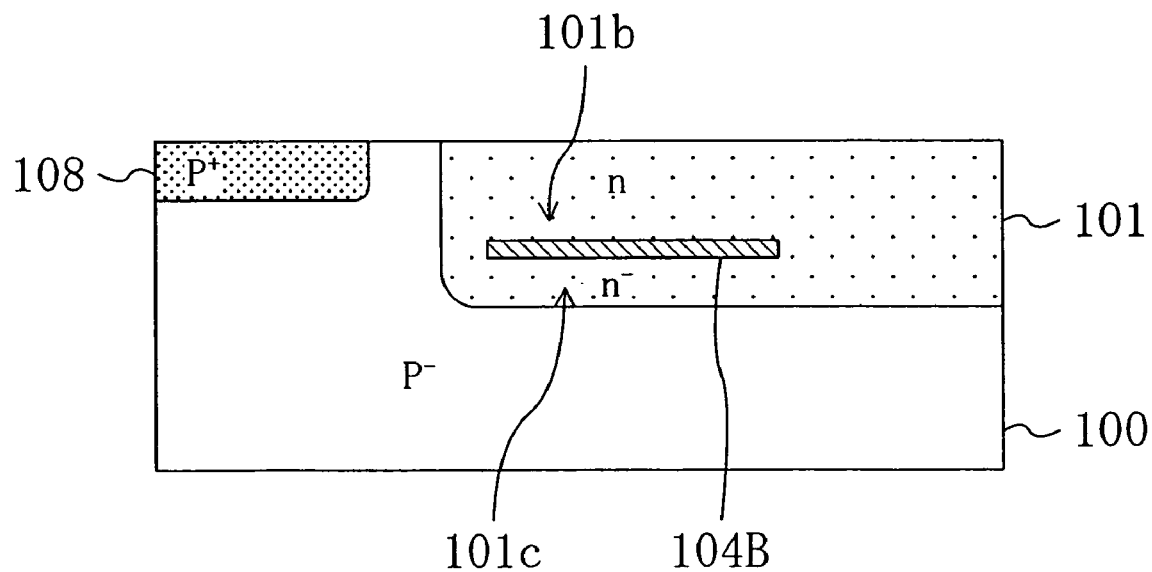

Then, as illustrated in FIG. 5B, a p-type impurity, e.g., boron ion, is implanted into the extended drain region 101 with an implantation energy of about 2.0 MeV to 3.0 MeV, thereby forming the second p-type buried layer 104B extending substantially parallel to the substrate surface at a depth of about 3.5 μm.

Figure 6A:
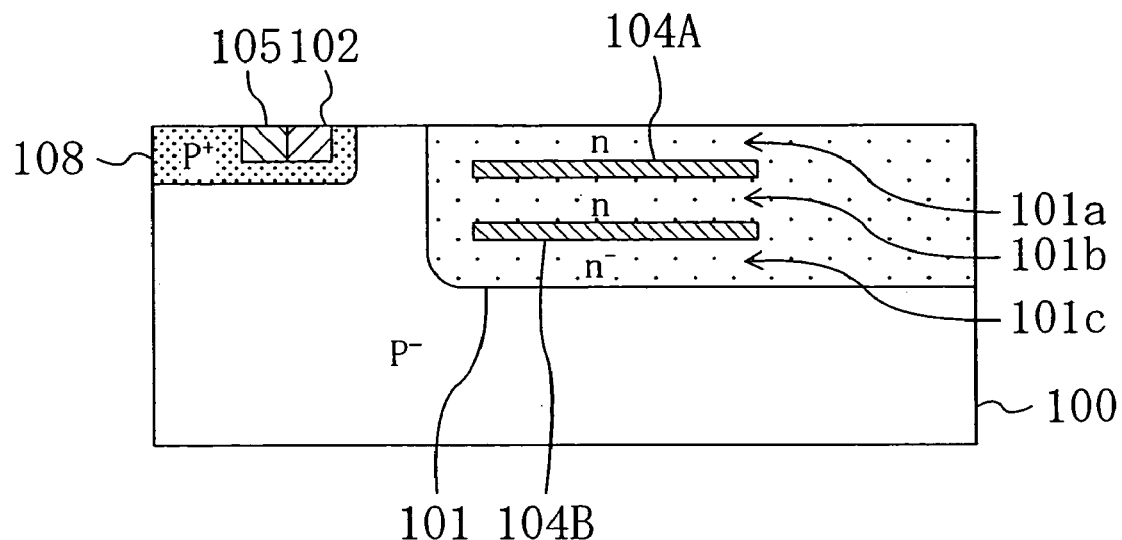
FIG. 6A and FIG. 6B are cross-sectional views sequentially illustrating steps in the method for manufacturing a semiconductor device according to the embodiment of the present invention.

Then, as illustrated in FIG. 6A, a p-type impurity, e.g., boron ion, is implanted into the extended drain region 101 with an implantation energy of about 1.0 MeV to 1.5 MeV, thereby forming the first p-type buried layer 104A extending substantially parallel to the second p-type buried layer 104B at a depth of about 1.0 μm. Then, the n-type source region 102 is formed in the anti-punch-through region 108. Then, a region in the anti-punch-through region 108 on one side of the source region 102 that is away from the extended drain region 101 is selectively implanted with a p-type impurity, e.g., boron ion, at a dose of about $4.5 \times 10^{15}/cm^3$, thereby forming the $p^{++}$-type substrate contact region 105 adjacent to the source region 102.

Figure 6B:
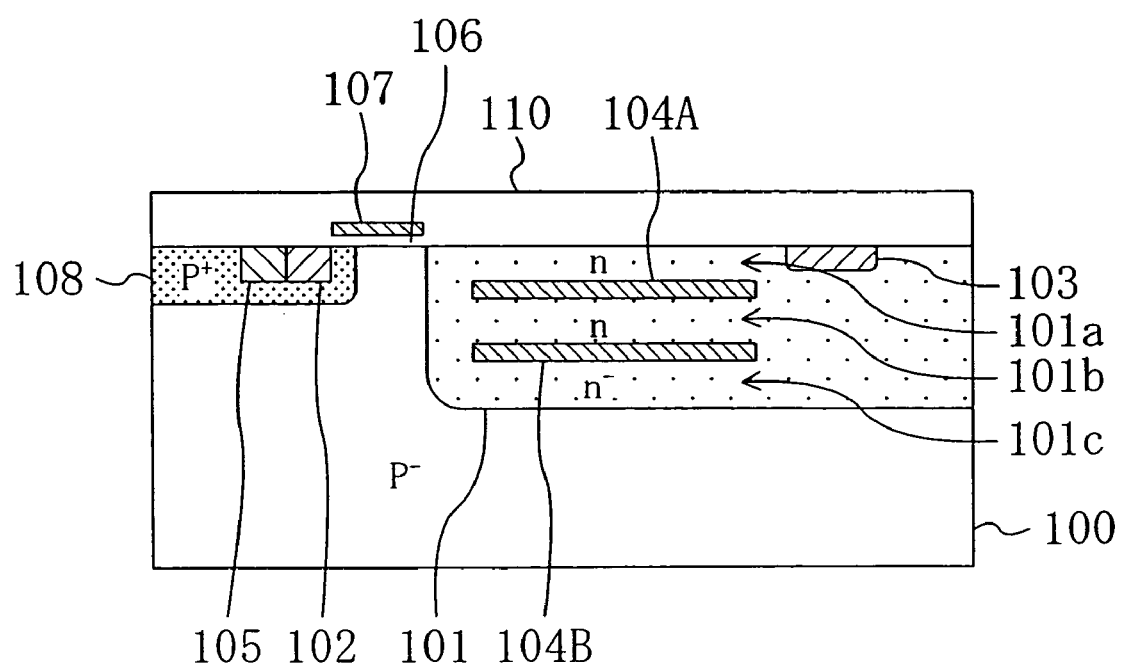

Then, as illustrated in FIG. 6B, the $n^{++}$-type drain contact portion 103 is selectively formed in an upper portion of the extended drain region 101 at one end of the semiconductor device that is opposite to the source region 102. Then, the gate electrode 107 made of a polysilicon film, for example, is formed on the semiconductor substrate 100, with the gate insulating film 106 being interposed therebetween, in an area between the extended drain region 101 and the source region 102. Then, the insulating film 110 is deposited so as to cover the entire surface of the semiconductor substrate 100, including the gate electrode 107 formed thereon.

Note that in the present embodiment, the order in which the source region 102, the substrate contact region 105 and the drain contact portion 103 are formed is not limited to any particular order.

Figure 7:
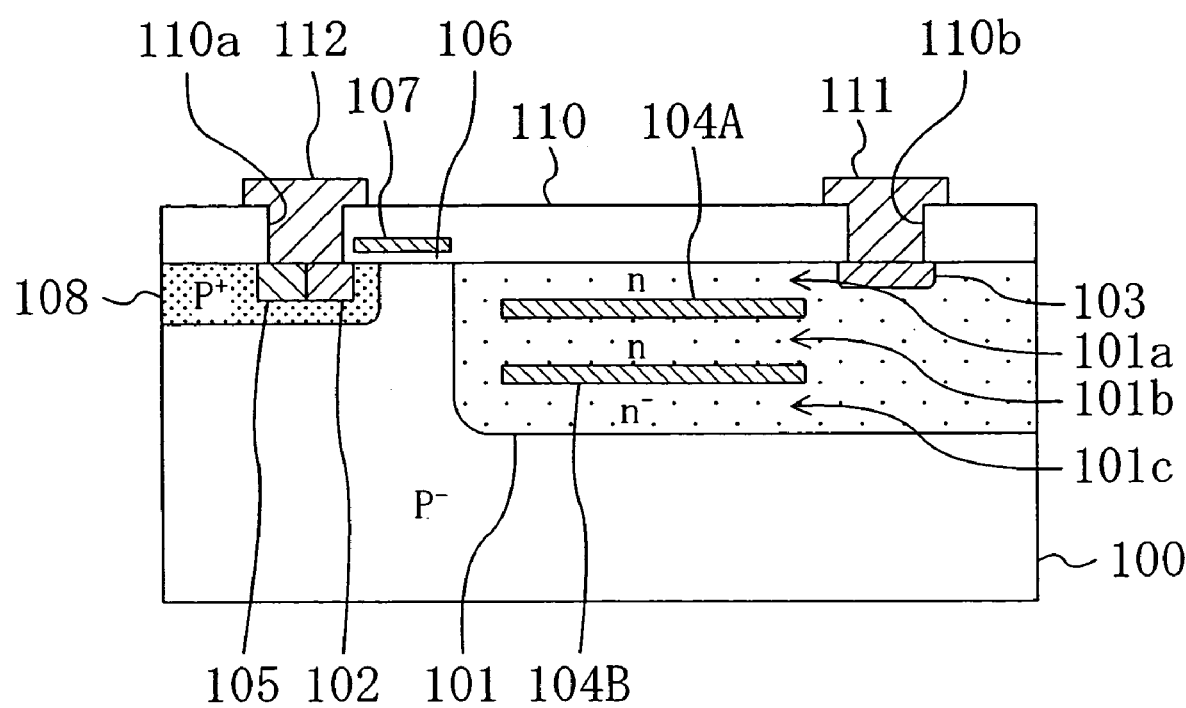
FIG. 7 is a cross-sectional view sequentially illustrating a step in the method for manufacturing a semiconductor device according to the embodiment of the present invention.

Then, a first contact hole 110a and a second contact hole 110b are formed in the insulating film 110, as illustrated in FIG. 7, so that the source region 102 and the substrate contact region 105 are exposed through the first contact hole 110a, and the drain contact portion 103 is exposed through the second contact hole 110b. Then, the source electrode 112 is formed on the insulating film 110 so as to fill the first contact hole 110a, and the drain electrode 111 is formed so as to fill the second contact hole 110b, thereby obtaining the semiconductor device of the present embodiment. The order in which the source electrode 112 and the drain electrode 111 are formed is not limited to any particular order.

First Variation

A first variation of the embodiment of the present invention will now be described with reference to the drawings.

Figure 8A:
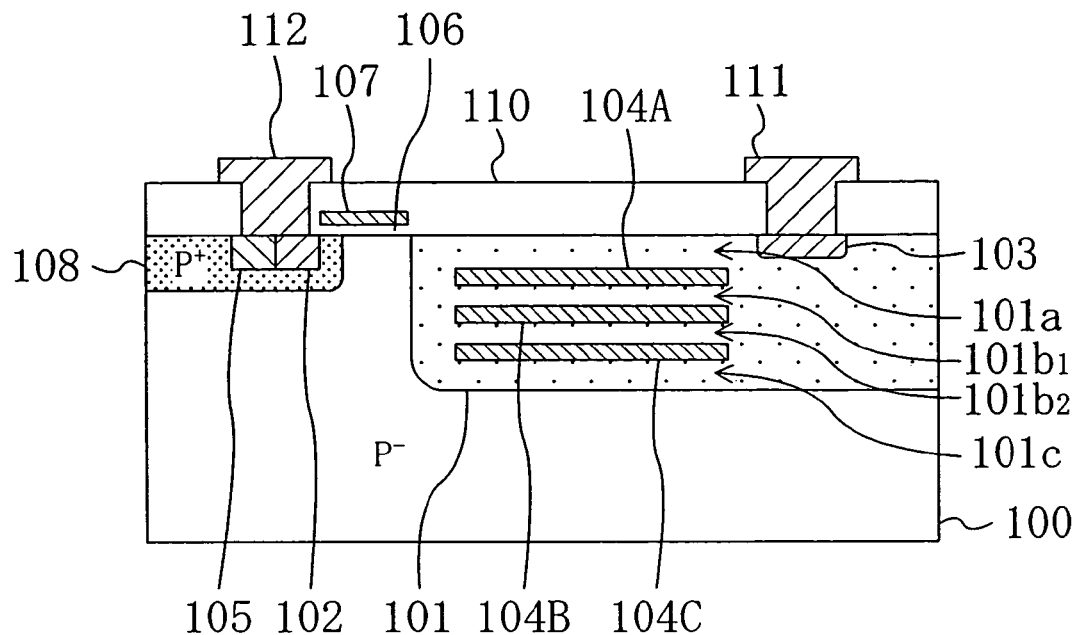

FIG. 8A is a cross-sectional view illustrating a semiconductor device according to the first variation of the embodiment of the present invention. In FIG. 8A, those elements that are already shown in FIG. 1 are denoted by the same reference numerals and will not be further described below.

As illustrated in FIG. 8A, the semiconductor device of the first variation includes the extended drain region 101. In the extended drain region 101, the first p-type buried layer 104A whose impurity concentration is about $1.5 \times 10^{16}/cm^3$ is formed at a depth of about 1.0 μm so as to extend substantially parallel to the substrate surface, the second p-type buried layer 104B whose impurity concentration is about $1.5 \times 10^{16}/cm^3$ is formed at a depth of about 4.0 μm so as to extend in parallel to the first p-type buried layer 104A, and a third p-type buried layer 104C whose impurity concentration is about $1.0 \times 10^{16}/cm^3$ is formed at a depth of about 6.0 μm so as to extend in parallel to the second p-type buried layer 104B.

Thus, the n-type upper layer region 101a is formed over the first p-type buried layer 104A, an n-type first intermediate layer region $101b_1$ is formed between the first p-type buried layer 104A and the second p-type buried layer 104B, an n-type second intermediate layer region $101b_2$ is formed between the second p-type buried layer 104B and the third p-type buried layer 104C, and the n⁻-type lower layer region 101c is formed under the third p-type buried layer 104C.

The p-type buried layers 104A, 104B and 104C are either all electrically connected to the semiconductor substrate 100 or all electrically floating.

As described above, the first variation is characterized in that the extended drain region 101 includes therein the three p-type buried layers 104A, 104B and 104C, with the impurity concentration of the third p-type buried layer 104C being lower than that of the first and second p-type buried layers 104A and 104B.

Figure 8B:
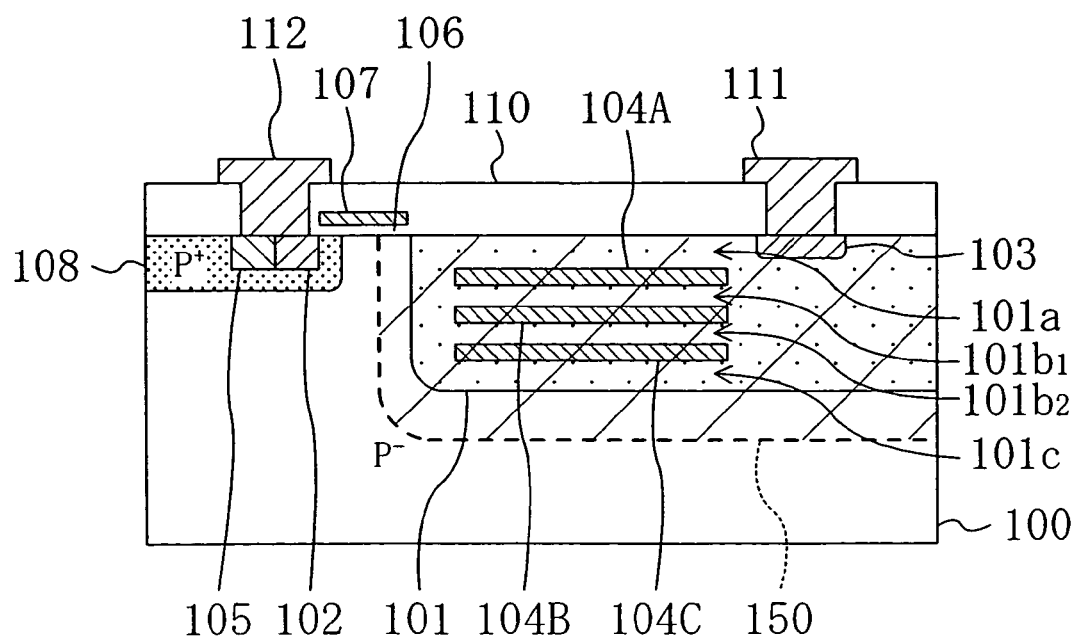

With such a structure, when a predetermined voltage is applied to the extended drain region 101, the depletion layer 150 expands around the extended drain region 101 as indicated by the hatched area in FIG. 8B. Since the interval between the upper layer region 101a, the first intermediate layer region $101b_1$, the second intermediate layer region $101b_2$ and the lower layer region 101c of the extended drain region 101 is smaller than that of the semiconductor device illustrated in FIG. 1, the depletion layer expands more easily. Moreover, since the impurity concentration of the third p-type buried layer 104C is lower than that of the other p-type buried layers 104A and 104B, the depletion layer expands more easily from the junction between the third p-type buried layer 104C and the second intermediate layer region $101b_2$ and from the junction between the third p-type buried layer 104C and the lower layer region 101c.

This makes it easier to ensure a high breakdown voltage, thereby making it easier to reduce the on-state resistance while ensuring a high breakdown voltage. Moreover, since it is easy to ensure a high breakdown voltage, the on-state resistance can easily be reduced by increasing the impurity concentrations of the upper layer region 101a, the first intermediate layer region $101b_1$, the second intermediate layer region $101b_2$ and the lower layer region 101c of the n-type extended drain region 101.

Therefore, according to the first variation, it is even easier to reduce the on-state resistance while ensuring a high breakdown voltage.

Second Variation

Figure 9:
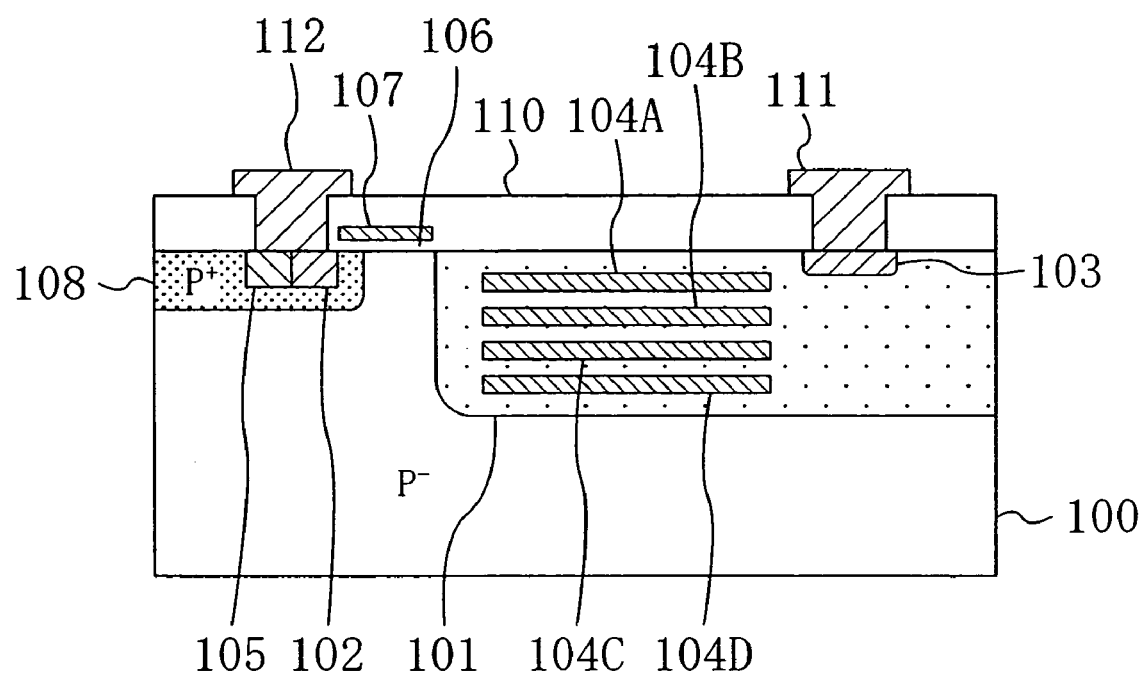
FIG. 9 is a cross-sectional view illustrating a semiconductor device according to a second variation of the embodiment of the present invention.
Figure 10:
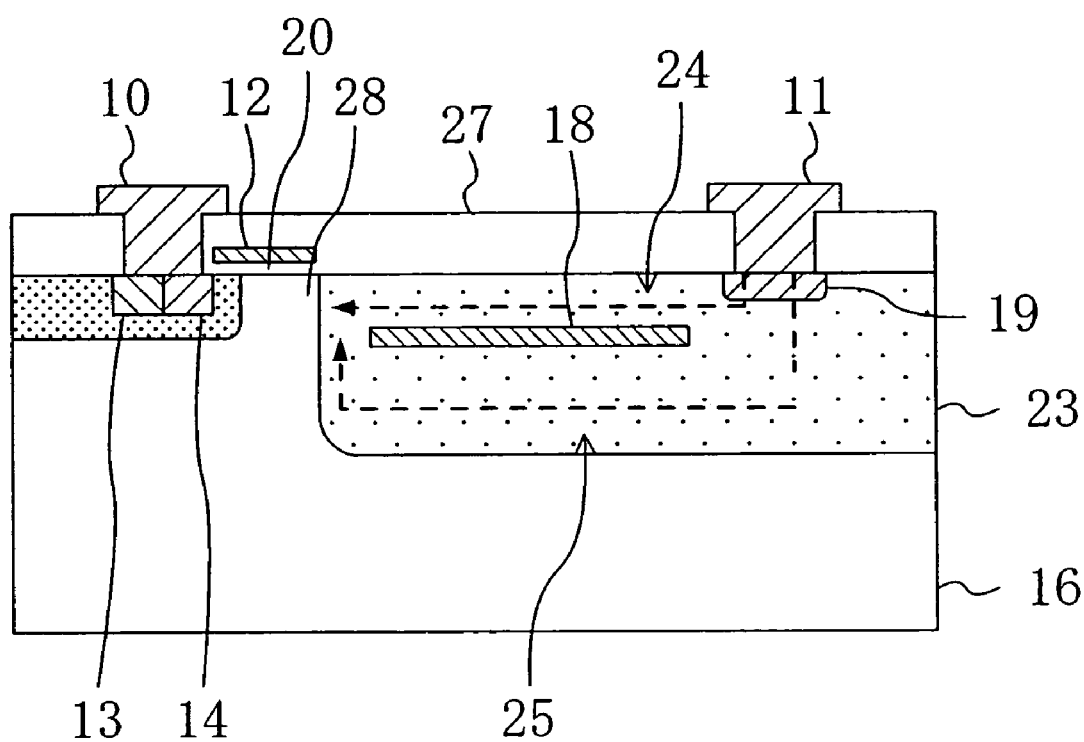
FIG. 10 is a cross-sectional view illustrating a first conventional semiconductor device having a high breakdown voltage.
Figure 11:
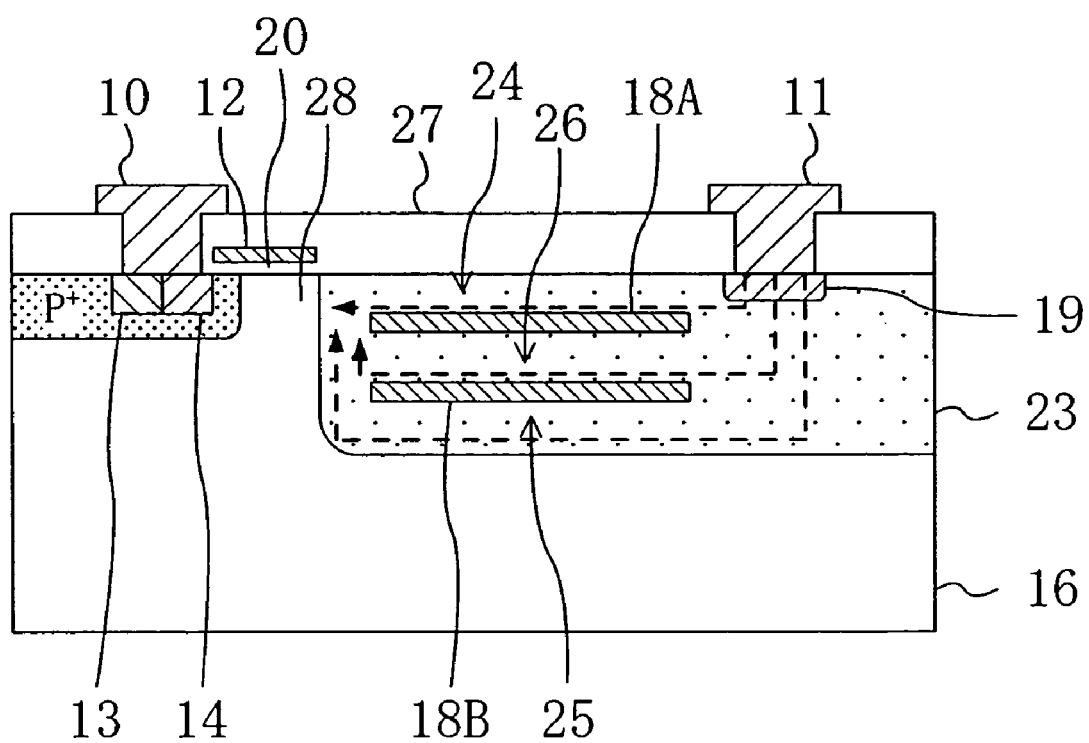
FIG. 11 is a cross-sectional view illustrating a second conventional semiconductor device having a high breakdown voltage.

According to a second variation, the extended drain region 101 may further include therein a fourth p-type buried layer 104D provided below the third p-type buried layer 104C so as to extend in parallel to the third p-type buried layer 104C with an interval therebetween, as illustrated in FIG. 9.

In this way, the depletion layer expands even more easily, whereby it is even more easy to reduce the on-state resistance while ensuring a high breakdown voltage.

What is claimed is:

1. A method for manufacturing a semiconductor device, comprising:
   a first step of selectively implanting a semiconductor substrate of a first conductivity type with impurity ion of a second conductivity type with an implantation energy that is equal to or greater than about 1.0 MeV and less than or equal to about 3.0 MeV so as to form an extended drain region of the second conductivity type in an upper portion of the semiconductor substrate; and
   a second step of forming a plurality of buried layers, each being an impurity layer of the first conductivity type, in the extended drain region so that the plurality of buried layers extend substantially parallel to a substrate surface with an interval therebetween in a depth direction.

2. The method for manufacturing a semiconductor device of claim 1, wherein the first step includes a step of performing a hear treatment on the semiconductor substrate so that a diffusion depth of the extended drain region is equal to or greater than about 5 μm and less than or equal to about 15 μm.

3. The method for manufacturing a semiconductor device of claim 1, wherein an the second step, the plurality of buried layers are successively formed by an ion implantation method, starting from the buried layer at a deepest position to the buried layer at a shallowest position in the extended drain region.

* * * * *